United States Patent [19]
Hirst

[11] Patent Number: 5,541,458
[45] Date of Patent: Jul. 30, 1996

[54] POWER SUPPLY FOR TIMED RESIDUAL POWER AFTER TURN OFF

[75] Inventor: B. Mark Hirst, Boise, Id.

[73] Assignee: Hewlett-Packard Company, Palo Alto, Calif.

[21] Appl. No.: 338,710

[22] Filed: Nov. 14, 1994

[51] Int. Cl.⁶ .................................................. H02J 3/08
[52] U.S. Cl. .......................... 307/66; 307/21; 307/22; 307/80; 307/81; 307/86; 307/87; 257/119; 323/237
[58] Field of Search .................... 307/66, 86, 87, 307/21, 22, 80, 81; 257/119; 323/237; 327/455

[56] References Cited

U.S. PATENT DOCUMENTS 4,384,213  5/1983  Bogel .................................. 307/64
4,521,693  6/1985  Johnson .............................. 307/252
5,325,209  6/1994  Manabe ............................... 358/437

Primary Examiner—William M. Shoop, Jr.
Assistant Examiner—Albert W. Paladini

[57] ABSTRACT

This invention relates to an improved laser printer power supply that maintains 24-, 12-, and 5 volt DC power to run exhaust fans for a brief period after the power switch is turned off. These fans remove undesirable ozone from the photo-conducting print drum so as to extend the life of the photo-conductor. The circuits utilize a timer circuit and an optically isolated photo-diac to turn a power triac on and off.

10 Claims, 2 Drawing Sheets

5,541,458

POWER SUPPLY FOR TIMED RESIDUAL POWER AFTER TURN OFF

FIELD OF THE INVENTION

This invention relates to an improved laser printer power supply that maintains 24 volt power to run exhaust fans for a brief period after the power switch is turned off. These fans remove undesirable ozone from the photo conducting print drum so as to extend the life of the photo conductor.

BACKGROUND OF THE INVENTION

Certain state-of-the-art laser printers presently utilize power supplies composed of a switching power supply combined with an auxiliary power supply. The switching power supply is used to provide the primary direct current (DC) voltages that the laser printer operates on. The switching power supply provides three operating voltages for the printer, +5 volts, +12 volts, and +24 volts. These are standard voltages with +5 volts used for the control computer, +12 volts used for analog circuitry, and +24 volts used for powering cooling fans, electric motors, electromechanical relays, and solenoids. The auxiliary power supply provides +22 volts and is used to power exhaust fans after the switching power supply has been turned off. The exhaust fans are powered for a short time after the printer has been turned off to vent ozone from the photo conducting print drum. Ozone generated from the printing process attacks the outer stirface of the photo conductor and decreases the useful life of the photo conductor. An electronic time delay senses loss of 24 volts DC and starts timing to allow the auxiliary power supply to operate for approximately three minutes to ensure that the ozone is sufficiently vented from the photo conductor.

The use of two power supplies to perform the function of supplying primary switching power and auxiliary power is very expensive. An auxiliary power supply utilizing +120 v AC or +240 v AC and supplying +22 v DC requires a bulky transformer.

The auxiliary power supply is always connected to the AC line which results in constant power consumption when the printed is turned off and higher power consumption when the printer is turned on. This higher power consumption results in higher operating temperatures within the printer power supplies, thereby requiring an extra 2-watt DC power supply cooling fan. The power consumption of the auxiliary power supply when plugged into 120 v AC is about 2 watts. Future regulatory requirements, both voluntary and non-voluntary will require a lower "turned off" power consumption.

The prior art method of using two power supplies, one for supplying operating power for the printer and a second for supplying auxiliary power to exhaust fans when the printer is turned off, requires a much larger and expensive power supply assembly. Space is at a premium in commodity grade laser printers so eliminating the secondary power supply reduces the cost of the power supply assembly and reduces the space, and its associated cost, that the power supply must reside in. This prior art also mandates the need for the extra DC power supply cooling fan.

It is, therefore, the purpose of this invention to: eliminate the auxiliary power supply, eliminate the DC power supply cooling fan, reduce the number of electronic devices, reduce the space required by the power supply, reduce power consumption, and reduce power supply assembly costs.

SUMMARY OF THE INVENTION

This invention is for a power supply for providing timed residual power after turn off comprising:

an AC power switching device providing voltage to AC and DC power circuits;

a timer circuit activated by a loss of AC power from an AC power switch;

an optically isolated photo-diac having an output from the timer circuit coupled to the AC power switching device;

a load switch driver circuit having an input from the power switch and having an opto-coupler output to a load switch circuit; wherein the loss of AC power from the AC power switch causes the timer circuit to continue to provide power to the AC and DC power circuits and to activate the load switch circuit.

In a second embodiment, the power supply does not require the load switch driver or load switch circuit.

DETAILED DESCRIPTION OF THE INVENTION

Figure 1:
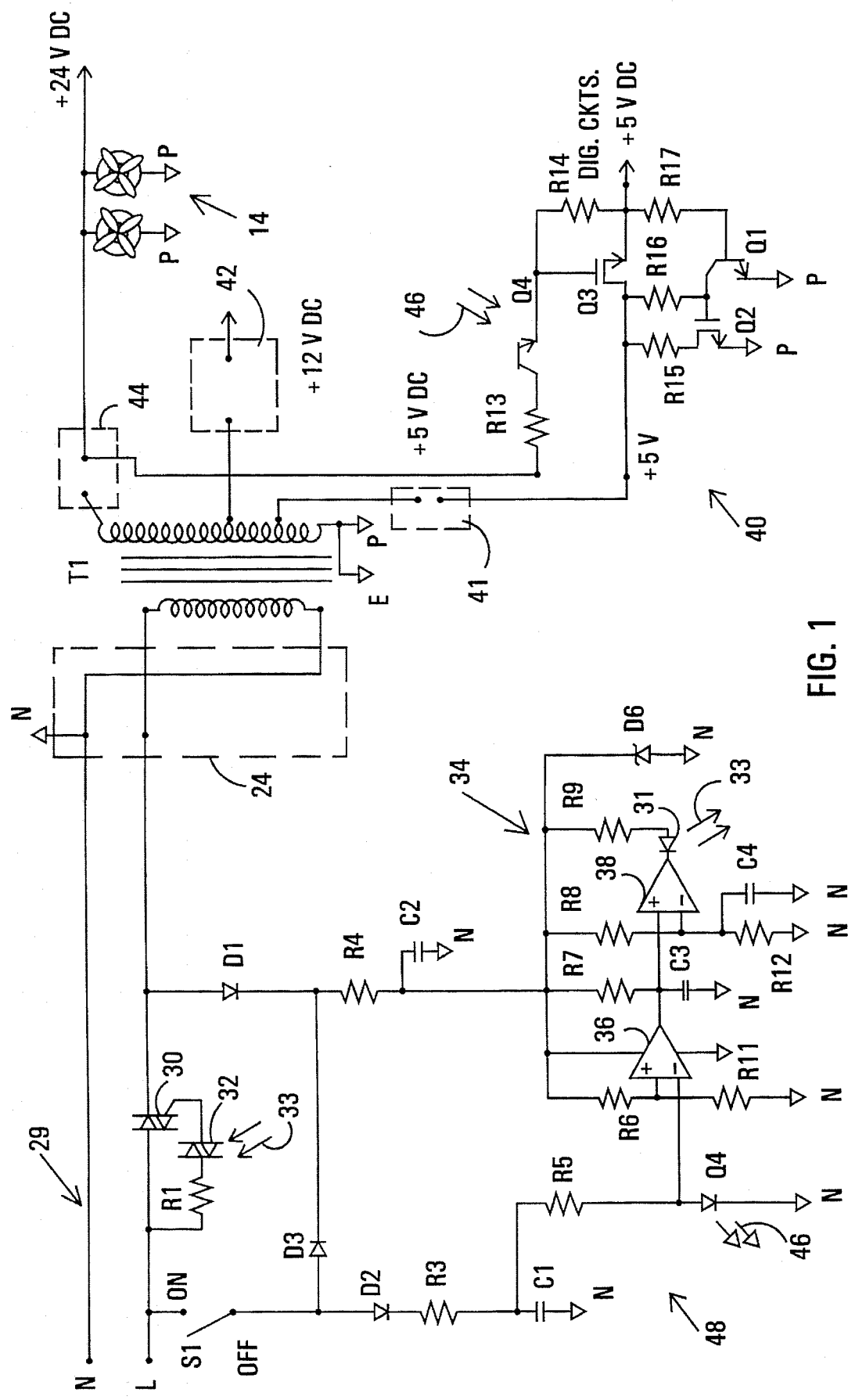
FIG. 1 is an electrical schematic of an improved printer power supply and timer of the present invention.

FIG. 1 illustrates the circuit modifications of the present invention that permit deleting the auxiliary power supply and the DC power supply cooling fan of the prior art.

In FIG. 1, the AC line switching function is performed by an AC power switching device 29 comprising triac 30 which is controlled by optically isolated photo-diac 31 and 32. This photo-diac shown as a Light Emitting Diode (LED) 31 in the timer circuit 34 add as a pair of back-to-back diodes 32 connecting at triac 30 is actually a single component that is optically coupled by internal light beam 33. A triac is a thyristor that can be triggered to conduct in either direction or, if non-triggered, possesses symmetrical bidirectional blocking voltage capabilities. In this case, the triggering comes from the operational amplifier timing circuit 34 that can provide a three-to-four-minute time delay via the optically isolated photo-diac 31 and 32. When triac 30 is triggered ON, AC power is connected to the AC front end 24 for an additional three minutes when switch S1 is opened (OFF) by means of time delay circuit 34. Time delay circuit 34 consists of a first op-amp (comparator) 36 and a second op-amp 38. These op-amps 36 and 38 are open collector types.

A load switch 40 provides a load, 10 ohm resistor R15, on the 5 volt power supply 41 so that the 5 v DC is regulated properly when the rest of the printer is off and only the 24 v DC exhaust fans 14 are running. The 5 volt load also keeps the 12 v and 24 v supplies, 42 and 44 respectively, at their proper voltage at this same time.

This load switch is activated by light 46 from load switch drive circuit 48. Drive circuit 48 has one-half of an opto-coupler Q4, appearing as a light emitting diode, and is coupled by internal light 46 to the transistor device Q4 in the load switch 40. Opto-coupler Q4 turns OFF Q3 and Q1, turning Q2 ON to load R15.

Approximate prototyped component characteristics are given in Table 1.

TABLE 1

| Component | Values | Component | Values |
|---|---|---|---|
| R1 | 220Ω | C1 | 10 µf |
| R3 | 10K | C2 | 10 µf |
| R4 | 8K | C3 | 10 µf |
| R5 | 2K | C4 | 10 µf |
| R6 | 110K | D6 | 30 v |
| R7 | 10M | Q1 | 2N2222 or similar |
| R8 | 20K | Q2 | IRF530 or MTP8N10 or similar |
| R9 | 2K | Q3 | IRF530 or MTP8N10 or similar |
| R11 | 10K | Triac | C25B40 or similar |
| R12 | 110K | Photo-diac | 521ME or similar |
| R13 | 10K | D1 | 1N4006 or similar |
| R14 | 10K | D2 | 1N4006 or similar |
| R15 | 10Ω | D3 | 1N4006 or similar |
| R16 | 10K | Q4 | PC111 or similar |
| R17 | 10K | Op-Amp 1,2 | LM333, LM393 or similar |

Operation will be described by referring to FIG. 1. We will start by assuming the power supply is OFF. When S1 closes (ON), D3 starts conducting and charges up C2, the power supply filter for analog circuitry. D2 conducts and charges up C1, the power supply for opto-coupler Q4. After C2 charges to about 5 volts, the comparators (36,38) start to function and optically isolated photo-diac 32 is turned on, which turns on the triac 30 and AC power is now presented to the switching power supply front end 24.

While S1 remains closed, LED Q4 emits light continuously and keeps the load switch 40 in the OFF state. In the OFF state, the load switch allows 5 v current to pass through Q3 and out to the printer digital circuits. Further, the power sense comparator 36 compares the voltage at the anode of Q4 to a reference formed by R6 and R11. As long as S1 remains closed, the voltage at the negative terminal of the comparator 36 is greater than the voltage at the positive terminal and the open collector outputs of the comparator 36 keep the timing circuit R7 and C3 discharged. The timing comparator 38 compares the voltage at the positive terminal from C3 to a reference formed by R8 and R12 at the negative terminal. As long as the voltage on the negative terminal is greater than the positive terminal, LED 31 is conducting and emitting light 33 to turn on the photo-diac 32 which keeps the triac 30 turned on and supplying AC current to the switching power supply front end 24.

When S1 opens (OFF), D3 no longer conducts and D1 starts conducting to supply current to C2, and D2 no longer conducts causing C1 to discharge and LED Q4 to turn OFF. When LED Q4 turns OFF, transistor Q4 turns OFF, Q3 turns OFF and +5 v DC current is no longer available to the digital circuits. When Q3 turns OFF, Q1 turns OFF allowing Q2 to turn ON. Q2 presents a minimum load to the switching power supply so that it maintains all voltages at their proper levels. In this particular supply, if a minimum load is not present, then the +24 v output "sags" to about 17 v and the exhaust fans do not run at the proper speed. Now, in this state, the only devices on the printer that are powered are the exhaust fans 14 due to timing circuit 34.

After Q4 turns OFF, the power sense comparator 36 allows C3 of the timing circuit 34 to be charged by R7 starting the 3.5 minute power time delay of timing circuit 34. After 3.5 minutes, when the voltage at the positive terminal of the timing comparator 38 is greater than the voltage at its negative terminal, the comparator turns OFF opto-coupler 31 and 32 which then causes the triac 30 to turn OFF and AC current is no longer supplied to the switching power supply front end 24. Components in the component list have been selected such that the timing comparator 38 allows the printer exhaust fans 14 to remain on for about 3.5 minutes. Further, D1 stops conducting, C2 discharges, and the comparators turn OFF. The printer is now fully turned OFF and essentially draws no power, i.e., less than 0.06 watts in circuitry not associated with the supply.

Figure 2:
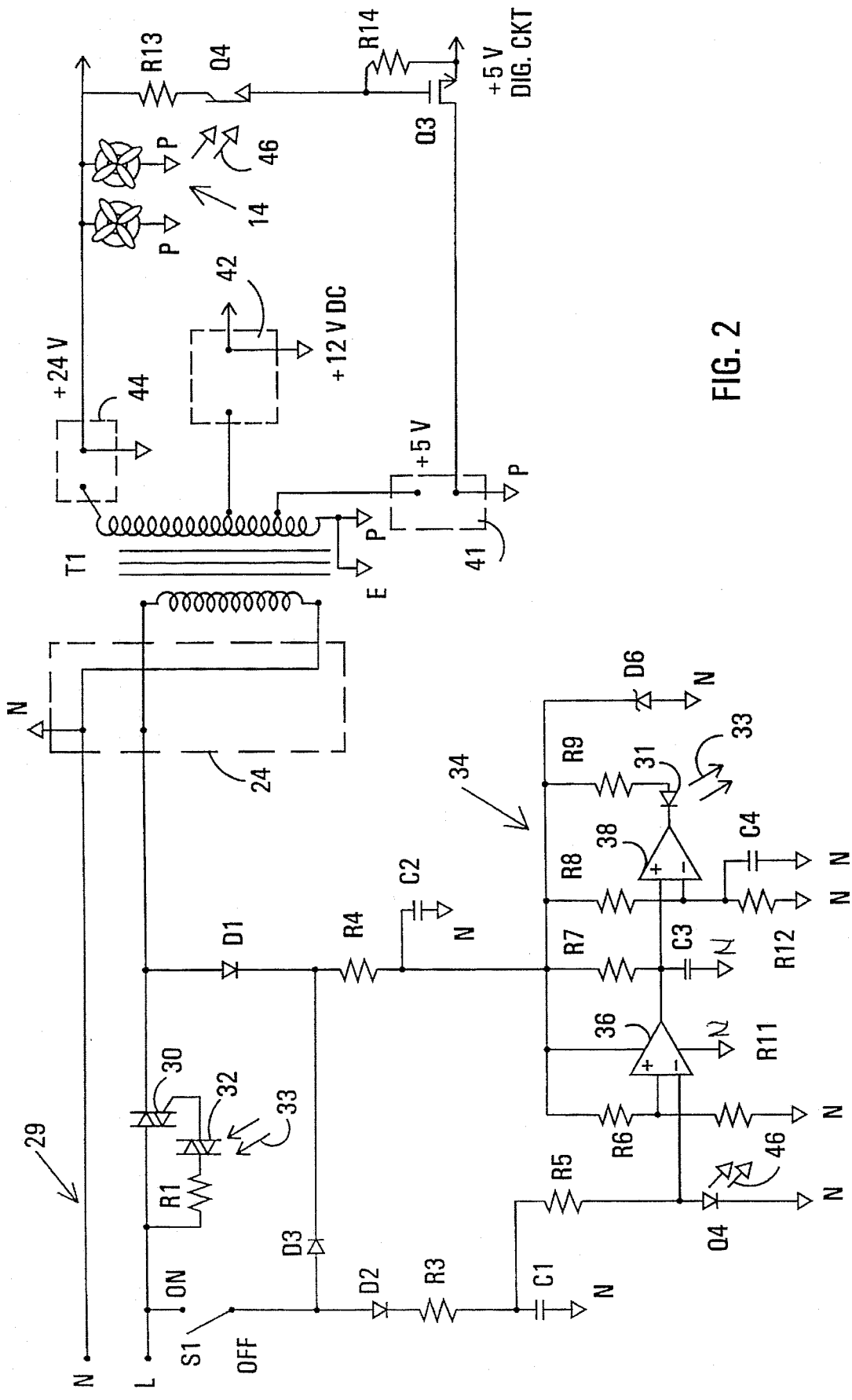
FIG. 2 is an electrical schematic of an improved printer power supply and timer without a load switch on the +5 v DC circuit.

It should be noted that in different types of switching power supplies, the load switch 40 may not be necessary. Use of a load switch depends only on the minimum loading necessary to stabilize the outputs of the 24 v, 12 v, and 5 v voltage regulators 44, 42, and 41, respectively, as seen in FIG. 2. In this case, the load switch 40 (FIG. 1) is not used and only Q4, R13, R14, and Q3 are needed to turn off the +5 v digital circuit supply.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A power supply for providing timed residual power after turn off comprising:
    (a) an AC power switching device providing voltage to AC and DC power circuits;
    (b) a timer circuit activated by a loss of AC power from an AC power switch;
    (c) an optically isolated photo-diac receiving an output from the timer circuit coupled to the AC power switching device; wherein the loss of AC power from the AC power switch causes the timer circuit to maintain power to the AC and DC power circuits for a predetermined period.

2. The power supply as recited in claim 1 wherein the AC power switching device further comprises a triac activated by the photo-diac.

3. The power supply as recited in claim 2 wherein the triac maintains AC and DC voltage for a period of three to four minutes after loss of the power from the AC power switch.

4. The power supply as recited in claim 3 wherein the DC voltage powers at least one exhaust fan.

5. A power supply for providing timed residual power after turn off comprising:
    (a) an AC power switching device providing voltage to AC and DC power circuits;
    (b) a timer circuit activated by a loss of AC power from an AC power switch;
    (c) an optically isolated photo-diac receiving an output from the timer circuit coupled to the AC power switching device;
    (d) a load switch driver circuit having an input from the power switch and having an opto-coupler output to a load switch circuit; wherein the loss of AC power from the AC power switch causes the timer circuit to maintain power to the AC and DC power circuits and to activate and maintain power to the load switch driver circuit.

6. The power supply as recited in claim 5 wherein the power switching device provides power to multiple DC voltage supplies and fans and further comprises a triac controlled by the optically isolated photo-diac.

7. The power supply as recited in claim 6 wherein the DC power circuit operates one or more fans and DC controls.

8. The power supply as recited in claim 7 wherein the triac and timer circuit provide AC and DC voltage for a period of three to four minutes after loss of power from the AC power switch.

9. A power supply for a laser printer that provides timed residual power after turn off comprising:
 (a) a triac providing voltage to AC and DC power circuits;
 (b) a timer circuit activated by a loss of AC power from an AC power switch;
 (c) an optically isolated photo-diac receiving an output from the timer circuit to the triac;
 (d) a load switch driver circuit having an input from the power switch and having an opto-coupler output to a load switch circuit; wherein the loss of AC power from the AC power switch causes the timer circuit to maintain power to the AC and DC power circuits and to activate and maintain Dower to the load switch driver circuit.

10. The power supply as recited in claim 9 wherein power is continued to the AC and DC power circuits and the load switch driver circuit for a period of three to four minutes after loss of power from the AC power switch.

* * * * *